United States Patent
Kiritani (10) Patent No.: US 6,787,093 B2
(45) Date of Patent: Sep. 7, 2004

(54) SEMICONDUCTOR RESIN MOLDING METHOD

(75) Inventor: Mika Kiritani, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 394 days.

(21) Appl. No.: 09/887,104

(22) Filed: Jun. 25, 2001

(65) Prior Publication Data

US 2002/0020940 A1 Feb. 21, 2002

(30) Foreign Application Priority Data

Jun. 26, 2000 (JP) .......................................... 2000-190547
Jun. 21, 2001 (JP) .......................................... 2001-188772

(51) Int. Cl.[7] .......................... B29C 45/02; B29C 45/14; B29C 70/78; B29C 33/18
(52) U.S. Cl. ............. 264/511; 264/272.14; 264/272.15; 264/272.17; 438/126; 438/127
(58) Field of Search .................. 264/40.1, 510, 264/511, 272.14, 272.15, 272.17, 275, 276; 425/116, 129.1, 162, 163, 544, 546; 438/126, 127

(56) References Cited

U.S. PATENT DOCUMENTS

| | | | |
|---|---|---|---|
| 4,944,908 A | * 7/1990 | Leveque et al. ............ 264/232 |
| 5,029,418 A | * 7/1991 | Bull ............................ 451/41 |
| 5,147,821 A | 9/1992 | McShane et al. | |
| 5,474,958 A | * 12/1995 | Djennas et al. ............... 29/827 |
| 5,846,477 A | * 12/1998 | Hotta et al. .................. 264/511 |
| 6,258,314 B1 | * 7/2001 | Oida et al. ................... 264/511 |
| 6,344,162 B1 | * 2/2002 | Miyajima ............. 264/272.14 |
| 6,444,492 B1 | * 9/2002 | Ohta .......................... 438/108 |
| 6,472,252 B2 | * 10/2002 | Mess .......................... 438/126 |
| 6,478,562 B1 | * 11/2002 | Miyajima .................... 425/89 |
| 6,638,791 B2 | * 10/2003 | Tieber ......................... 438/113 |
| 6,652,799 B2 | * 11/2003 | Seng et al. .................. 264/511 |

FOREIGN PATENT DOCUMENTS

| | | |
|---|---|---|
| JP | 2-295140 | 12/1990 |
| JP | 5-55280 | 3/1993 |

* cited by examiner

Primary Examiner—Angela Ortiz
(74) Attorney, Agent, or Firm—Finnegan, Henderson, Farabow, Garrett & Dunner, L.L.P.

(57) ABSTRACT

A resin tape substrate with a semiconductor chip mounted thereon is put to an attachment area surface of a cavity bottom surface, and a plurality of suction holes connected to a suction system are disposed in the attachment area surface, wherein the attachment area surface of the cavity is formed in a semiconductor resin mold, so that the molten resin given into the cavity does not flow into the back surface of the resin tape substrate which is sucked on the attachment area surface in the mold.

9 Claims, 5 Drawing Sheets

SEMICONDUCTOR RESIN MOLDING METHOD

CROSS-REFERENCE TO RELATED APPLICATIONS

This application is based upon and claims the benefit of priority from the prior Japanese Patent Application No. 2000-190547, filed Jun. 26, 2000, the entire contents of which are incorporated herein by reference.

BACKGROUND OF THE INVENTION

The present invention relates to a semiconductor resin mold and a semiconductor resin molding method using the mold, particularly to a resin mold for use in molding a semiconductor chip mounted on a resin tape substrate having a circuit wiring with a resin on the resin tape substrate and a semiconductor resin molding method using the mold.

In recent years, with size and cost reduction of an electronic apparatus, a resin molded semiconductor device for use in the electronic apparatus is requested to be thin and dense, and productivity enhancement and cost reduction are further required. Instead of the usual semiconductor device constituted by molding a semiconductor chip mounted on a lead frame with a resin, a BGA resin molded semiconductor device of a resin tape type has been developed by mounting a plurality of semiconductor chips on a resin tape substrate having a circuit wiring, molding the semiconductor chip with the resin on the resin tape substrate, disposing a metal ball electrode on a back surface of the resin tape substrate, and cutting/separating the substrate into semiconductor chip units.

A resin molding method of the latter semiconductor device will be described hereinafter.

First, the resin tape substrate with a plurality of semiconductor chips mounted thereon is prepared, and a mold constituted of upper and lower mold members is prepared. Each semiconductor chip is fixed onto a chip mounting surface of the resin tape substrate via an adhesive layer, and connected to the circuit wiring formed on the resin tape substrate via a bonding wire.

Subsequently, the resin tape substrate is disposed between the upper and lower mold members of the resin mold. In this case, respective semiconductor chip mount portions are disposed in a plurality of cavities formed by the upper and lower mold members, and the back surface of the resin tape substrate is closely attached to an attachment area surface of a bottom surface of the cavity.

Subsequently, a resin tablet is introduced into a pot disposed to the mold, heated and molten. The molten resin is pressurized by a plunger of a transfer mold apparatus, and supplied into the cavity from the pot through a runner and inflow gate. Thereby, the respective semiconductor chips are altogether molded by the resin on the mount portion of the resin tape substrate, and a resin molded body with the back surface of the resin tape substrate exposed therefrom is formed.

Subsequently, the respective metal ball electrodes are disposed on an external electrode of the circuit wiring exposed to the back surface of the resin tape substrate, and the resin tape substrate is diced to separate individual resin molded semiconductor devices.

As described above, in the resin molding process of the resin molded semiconductor devices using the resin tape substrate, in order to expose the back surface of the resin tape substrate from the molding resin, the back surface of the resin tape substrate needs to be attached fixedly to the attachment area surface of the bottom surface in the cavity of the mold.

Here, since a tape material of the resin tape substrate, adhesive layer for fixing the semiconductor chip, solder resist for protecting and covering the circuit wiring, semiconductor chip, and circuit wiring material are formed of different materials, the materials are different from one another in thermal expansion coefficient. When the materials are heated, for example, at 180° C. during molding, the resin tape substrate warps toward the semiconductor chip because of the difference of the thermal expansion coefficient. Therefore, the resin tape substrate floats above the attachment area surface of the bottom surface of the cavity, and the molten resin charged into the cavity disadvantageously enters to a space between the back surface of the resin tape substrate and the cavity surface.

Since the back surface of the resin tape substrate is covered with the resin entered into the space between the back surface of the resin tape substrate and the cavity surface in this manner, a molding defect occurs in the resin molded body.

Also on the side of the semiconductor chip attached to the upper surface of the resin tape substrate, since the substrate is curved in the cavity, a part of the resin tape substrate disadvantageously contacts, for example, a cavity ceiling portion. Therefore, a portion insufficiently filled with the resin is generated, and the molding defect occurs in the resin molded body. Therefore, a yield of the resin molded semiconductor device is lowered, and productivity is remarkably deteriorated.

BRIEF SUMMARY OF THE INVENTION

According to a first aspect of the present invention, there is provided a semiconductor resin mold comprising:
  a resin molding cavity having an attachment surface to which a resin tape substrate with a semiconductor chip mounted thereon is attached; and
  a plurality of suction holes opened in the attachment surface and connectable to a suction system.

According to the first aspect of the present invention, the resin tape substrate with the semiconductor chip mounted thereon is firmly attached onto the attachment area surface of the bottom surface of the cavity by the suction holes opened in the attachment area surface of the bottom surface of the cavity formed in the mold and connected to the suction system. Therefore, the resin tape substrate can be prevented from warping by heating during resin molding, and the molten resin supplied in the cavity can be prevented from disadvantageously entering to the back surface of the resin tape substrate.

According to a second aspect of the present invention, there is provided a semiconductor resin molding method of sealing a semiconductor chip mounted on a resin tape substrate with a resin molded body excluding a back surface of the resin tape substrate. The method comprising:
  preparing a mold comprising a cavity having a plurality of suction holes connectable to a suction system in an attachment surface to which the resin tape substrate is attached;
  attaching the resin tape substrate to the attachment surface of the cavity of the mold;
  sucking/fixing the resin tape substrate to the attachment surface of the cavity after the step of attaching the resin tape substrate to the attachment surface; and supplying a resin into the cavity of the mold after the step of sucking/fixing the resin tape substrate onto the attachment surface.

According to the second aspect of the present invention, the resin tape substrate with the semiconductor chip mounted thereon is attached to the attachment area surface of the bottom surface of the cavity. After the resin tape substrate is firmly attracted onto the attachment area surface of the cavity bottom surface by the suction holes opened in the attachment area surface of the bottom surface of the cavity, the resin molding is performed. Therefore, the resin tape substrate can be prevented from warping by heating during resin molding, and the molten resin supplied in the cavity is prevented from entering to the back surface of the resin tape substrate. This can avoid occurrence of a molding defect of the resin molded body with the resin tape substrate back surface exposed therefrom, and can also prevent the occurrence of a resin uncharged portion on the side of the semiconductor chip on the upper surface of the resin tape substrate. Therefore, the productivity of the resin molded semiconductor device can remarkably be enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Embodiments of the present invention will be described hereinafter in detail with reference to the drawings.

(First Embodiment)

A first embodiment of the present invention will be described in detail with reference to FIGS. 1A, 1B, 1C, 2, 3, and 4.

Figure 3:
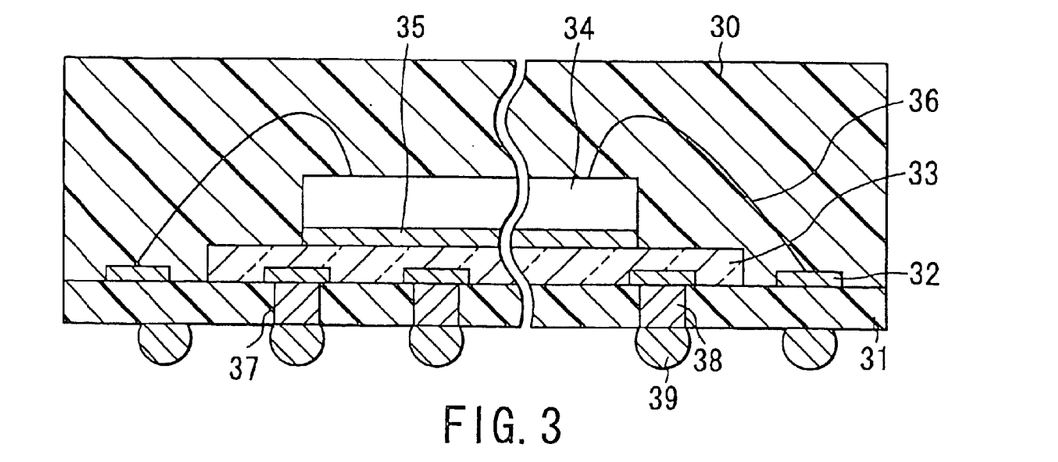
FIG. 3 is an enlarged sectional view showing a resin molded semiconductor device molded with the semiconductor resin mold according to the first aspect of the present invention and diced.

FIG. 3 shows one example of an inner structure of a resin molded semiconductor device manufactured with a semiconductor resin mold according to a first embodiment of the present invention. In FIG. 3, a resin tape substrate 31 has a thickness of about 75±8 $\mu$m, a circuit wiring 32 is formed on an upper surface of the substrate 31 via an adhesive, and a solder resist 33 having a thickness of 10±5 $\mu$m is formed as a protective film on the circuit wiring 32. The solder resist 33 is to be formed under a semiconductor chip 34.

The semiconductor chip 34 is fixed onto the solder resist 33 on the resin tape substrate 31 via an adhesive material 35, and electrodes of the semiconductor chip 34 are electrically connected to the circuit wiring 32 via bonding wires 36.

Moreover, a plurality of through holes 37 are formed in the resin tape substrate 31, and an external electrode 38 is formed in the through holes 37 so that one end of the electrode 38 is exposed in a back surface of the resin tape substrate 31. Furthermore, the upper surface of the resin tape substrate 31 including mount portions such as the circuit wiring 32, semiconductor chip 34, and bonding wire 36 are sealed with a resin molded body 30. Then, the resin molded body 30 is constituted such that the back surface of the resin tape substrate 31 is exposed.

Additionally, after the resin molded body 30 is molded, a metal ball electrode, for example, a solder ball 39 is formed on the end of the external electrode 38.

Figure 1A:
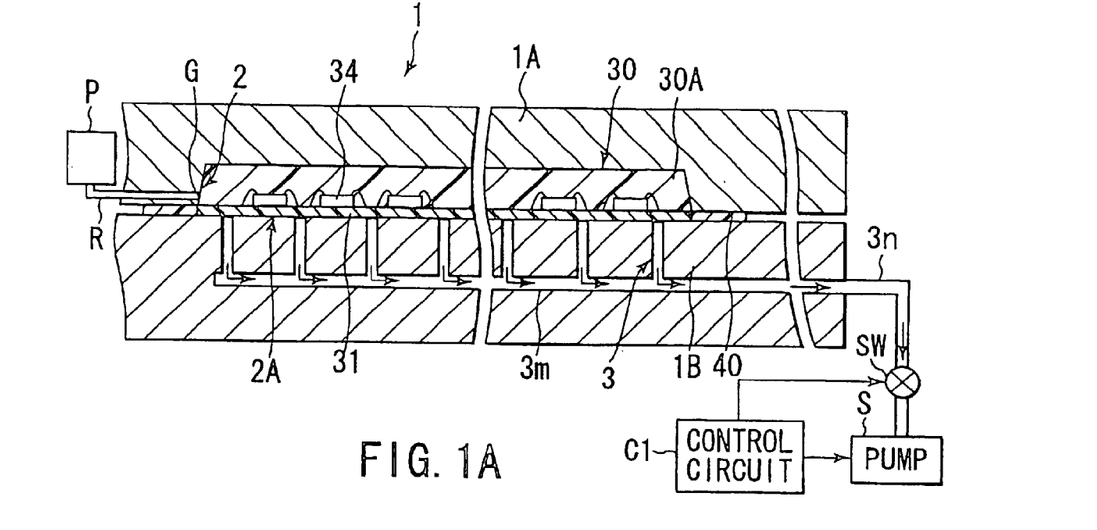
FIGS. 1A and 1B are longitudinal and transverse sectional views of a semiconductor resin mold according to a first embodiment of the present invention.

A plurality of resin molding bodies 30 are simultaneously molded in a transfer mold apparatus (not shown). As shown in FIG. 1A, a mold 1 is attached to a molding section of the transfer mold apparatus.

In FIG. 1A, the mold 1 is constituted of upper and lower mold members 1A and 1B, and is provided with a cavity 2 formed by assembling the members 1A, 1B as shown in FIG. 1A. The cavity 2 is formed mainly by a concave portion formed in the upper mold member 1A, and defined by a space formed between the concave portion and the resin tape substrate 31 laid on the lower mold member 1B. The mold members 1A and 1B are formed of a metal.

A pot P for receiving a resin tablet (not shown) is attached to the upper mold member 1A, and a runner R and inflow gate G are formed in association with the upper mold member 1A so that the runner R and the inflow gate G are connected to the pot P. The resin tablet in the pot P is heated and a molten resin formed at the pot P flows into the cavity 2 via the runner R and inflow gate G.

An attachment area surface for the resin tape substrate 31 is formed in a bottom surface 2A of the cavity 2, that is, the inner surface of the lower mold member 1B, and the resin tape substrate 31 is attached to the attachment area surface.

Figure 1B:
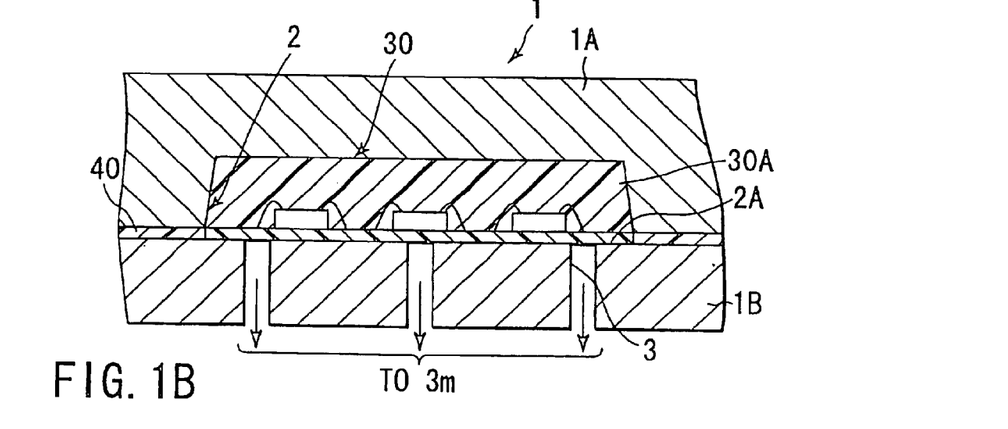
Figure 2:
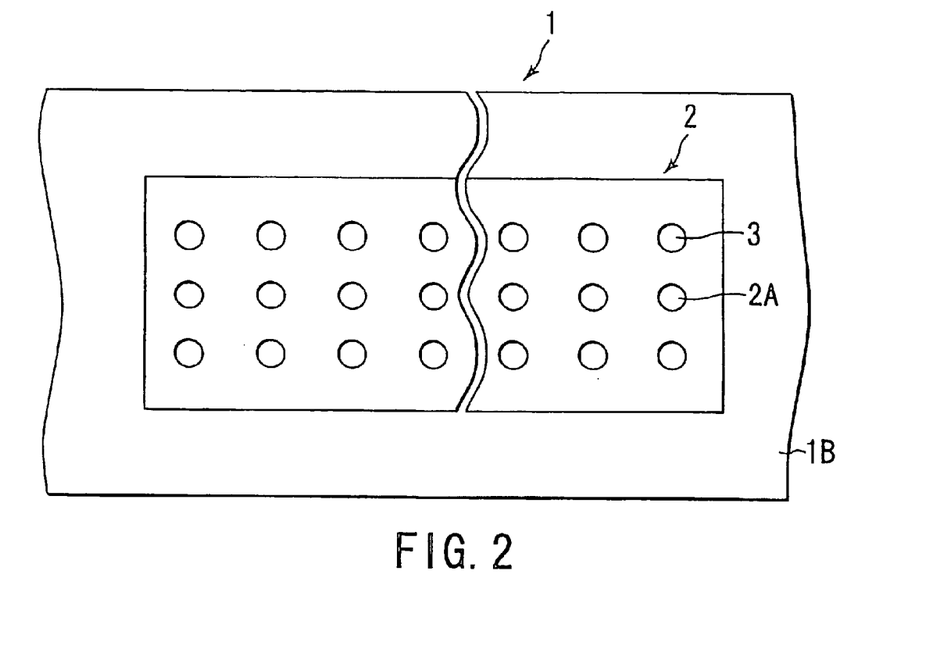
FIG. 2 is a plan view showing an attachment area of the resin tape substrate in a lower mold member of the semiconductor resin mold.

As shown in FIGS. 1A, 1B and FIG. 2, a plurality of suction holes 3 formed in the lower mold member 1B are opened in the attachment area surface of the bottom surface 2A of the cavity 2 to which the resin tape substrate 31 is to be attached.

The suction holes 3 are equally arranged in the whole attachment area surface in a matrix fashion in row and column directions. Here, as shown in FIG. 2, three rows of suction holes 3 are formed in a longitudinal direction of the bottom surface 2A of the cavity 2 as the attachment area surface, and a plurality of columns of circular suction holes 3 having substantially the same diameter are opened/arranged in the column direction.

As shown in FIG. 1A, the plurality of suction holes 3 are connected to a common suction path 3m formed in the lower mold member 1B, and connected to a suction pump S constituting a suction system via an external path 3n and switch SW. Additionally, the plurality of suction holes 3 may also be led out of the lower mold member 1B individually and connected to the suction pump S.

The aforementioned suction system is constituted of the switch SW for connecting/disconnecting the suction hole 3 with respect to atmosphere, the suction pump S such as a vacuum pump for reducing a pressure of the suction holes 3, the pump switch SW and a control circuit C for controlling the vacuum pump S. A sucking/stopping operation of the pump S, and a connecting/disconnecting operation of the switch SW with respect to the atmosphere are controlled based on a signal generated from the control circuit C.

A method of molding the resin molded body 30 of the resin molded semiconductor device using the resin mold 1 will next be described with reference to FIGS. 1A to 1C, 2 and 4.

Figure 1C:
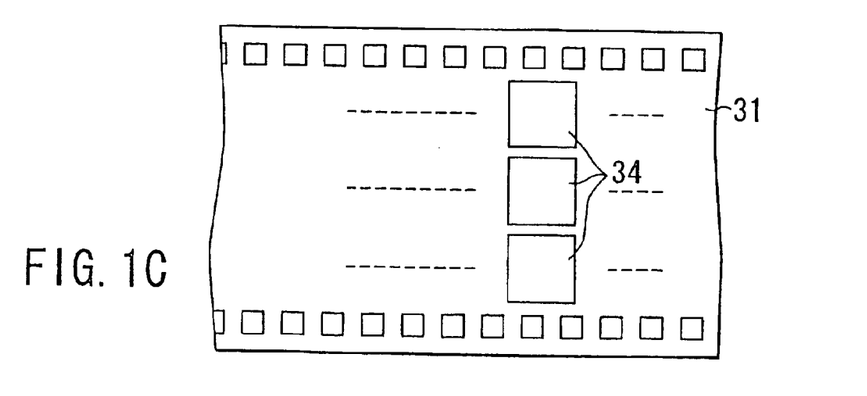
FIG. 1C is a plan view of a resin tape substrate with a semiconductor chip mounted thereon.
Figure 4:
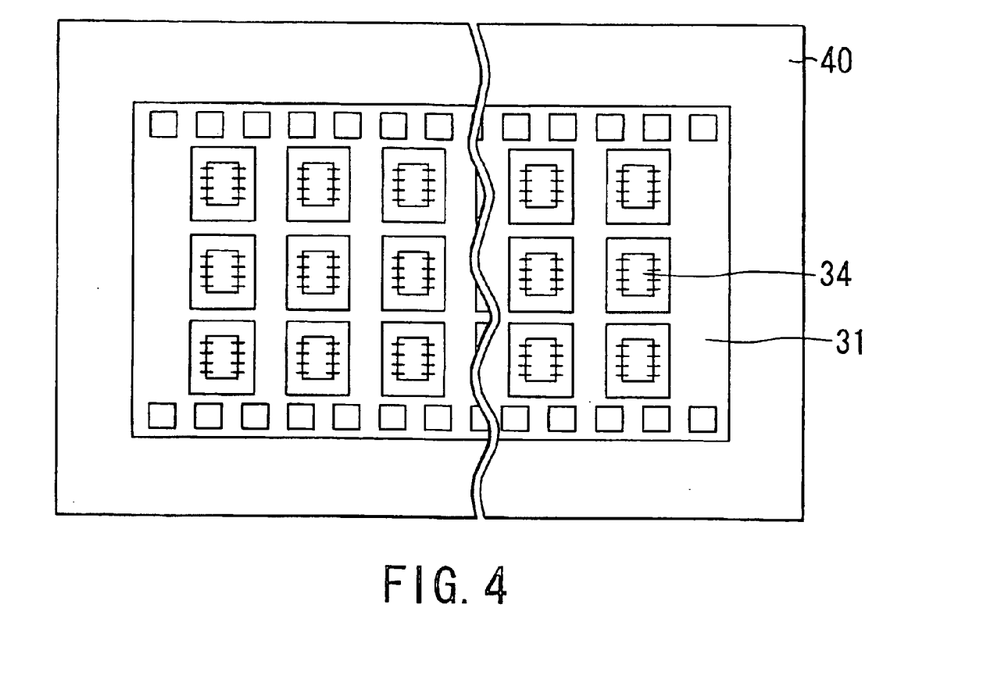
FIG. 4 is a plan view showing that the resin tape substrate is held by a carrier shown in FIG. 1A.

First, as shown in FIG. 1C and FIG. 4, the resin tape substrate 31 with a plurality of semiconductor chips 34 mounted thereon is contained in a frame carrier 40 whose inner size is the same as a size of the resin tape substrate 31. Furthermore, the carrier 40 has substantially the same plate thickness as that of the resin tape substrate 31, and holds the resin tape substrate 31. As shown in FIG. 3, the plurality of semiconductor chips 34 are mounted on the upper surface of the resin tape substrate 31, and the electrodes of each semiconductor chip 34 are electrically connected to the circuit wiring 32 via the bonding wires 36.

In addition to the resin tape substrate 31 held by the carrier 40, the mold 1 is prepared.

Subsequently, the carrier 40 is disposed between the upper mold member 1A and the lower mold member 1B of the mold 1. The resin tape substrate 31 including mount portions such as the semiconductor chip 34, circuit wiring 32, and bonding wire 36 is held by the carrier 40 and disposed in the cavity 2 formed by the upper and lower mold members 1A and 1B. Additionally, the back surface of the resin tape substrate 31 is closely attached to the attachment area surface of the bottom surface 2A of the cavity 2.

Subsequently, the suction pump S of the suction system connected to the plurality of suction holes 3 is driven by an output of the control circuit C, and air in the suction hole 3 is sucked to reduce the pressure in the cavity 2. As a result, the resin tape substrate 31 is sucked/fixed onto the attachment area surface of the bottom surface 2A of the cavity 2.

Figure 9:
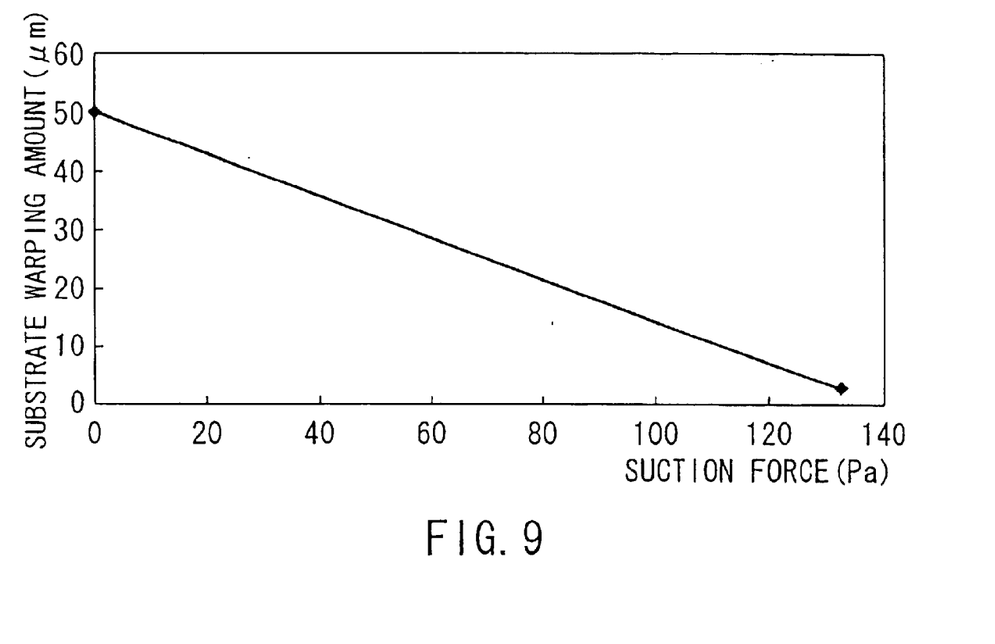
FIG. 9 is a graph showing a relation between a warping amount of the resin tape substrate and a suction force of the suction system according to the second embodiment of the present invention.
Figure 10:
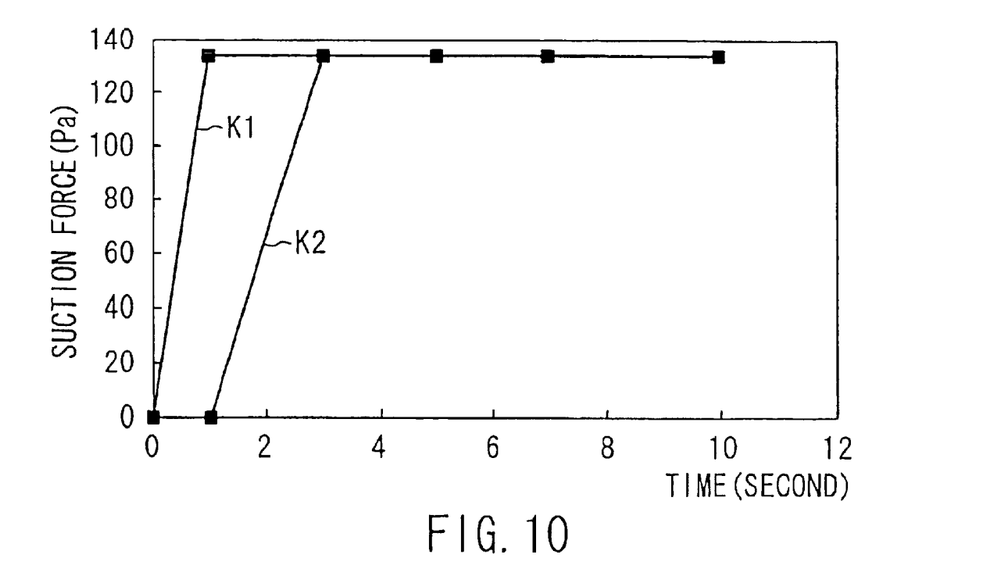
FIG. 10 is a graph showing an operation of two suction systems in the embodiment of FIG. 5.

In this case, a relation between a warping amount ($\mu$m) of the substrate 31 and a suction force (Pa) of the suction pump S is shown in FIG. 9. As shown in FIG. 9, the warping amount of the substrate 31 indicates substantially zero in the suction force of about 130 (Pa).

At this time, the switch SW is opened by the output of the control circuit C, and the suction pump S performs suction based on the control signal of the control circuit C.

Subsequently, the resin tablet in the pot P is heated and molten, the pot P is pressurized by a plunger (not shown) of a transfer mold apparatus, and a molten resin 30A is supplied into the cavity 2 from the pot P via the runner R and inflow gate G.

By this step, the upper surface of the resin tape substrate 31 including the mount portions such as the semiconductor chip 34, bonding wire 36, and circuit wiring 32 is molded with the resin. In this state, since the back surface of the resin tape substrate 31 is fixedly attached/sucked onto the lower mold member 1B, the resin 30A does not flow to the back surface, and the resin molded body 30 with the back surface of the substrate 31 exposed therefrom is molded.

Subsequently, the suction of the suction pump S is stopped by the output of the control circuit C, the switch SW is opened, and the reduced pressure in each of the plurality of suction holes 3 is returned to atmospheric pressure. The stopping of the suction pump S and the opening/closing operation of the switch SW are performed based on the control signal of the control circuit C.

Subsequently, the resin tape substrate 31 sealed with the resin molded body 30 is extracted from the mold 1, and the metal ball electrodes 39 such as solder balls are formed on the respective external electrodes 38 exposed via the back surface of the resin tape substrate 31, for example, by a known solder dipping process.

Thereafter, the resin molded body 30 is diced and divided into individual pieces, so that the resin molded semiconductor device is completed as shown in FIG. 3.

According to the first embodiment, the following action/effect is obtained.

That is, in the resin mold, a plurality of suction holes 3 connected to the suction pump S are formed to be open in the attachment area surface of the bottom surface 2A of the cavity 2. Thereby, the resin tape substrate 31 with the semiconductor chip 34 mounted thereon is firmly sucked/fixed onto the attachment area surface of the bottom surface 2A of the cavity 2 by the suction holes 3 formed in the attachment area surface of the bottom surface 2A of the cavity 2. Therefore, the resin tape substrate 31 can be prevented from warping by heating during resin molding, and a disadvantage that the resin supplied into the cavity 2 enters to the back surface of the resin tape substrate 31 can be avoided.

Moreover, in the resin molding method, the resin tape substrate 31 with the semiconductor chip 34 mounted thereon is attached to the attachment area surface of the bottom surface 2A of the cavity 2. Subsequently, the resin tape substrate 31 is firmly sucked/fixed onto the attachment area surface of the bottom surface 2A of the cavity 2 by the plurality of suction holes 3 formed in the attachment area surface of the bottom surface 2A of the cavity 2, and the resin molding is performed. This can prevent the resin tape substrate 31 from warping by heating during the resin molding, and therefore the resin supplied into the cavity 2 is prevented from flowing to the back surface of the resin tape substrate 31. Therefore, this can prevent a molding defect of the resin molded body with the back surface of the resin tape substrate 31 exposed therefrom, and a molding defect of the resin molded body because of a resin uncharged portion in the semiconductor chip 34 on the upper surface of the resin tape substrate 31. Additionally, the productivity of the resin molded semiconductor device can remarkably be enhanced.

(Second Embodiment)

A method of manufacturing the resin molded body by the semiconductor resin mold according to a second embodiment of the present invention will be described with reference to FIG. 5 to FIG. 10. Additionally, the same portions as those of the first embodiment are denoted with the same reference numerals, redundant description is omitted, and only different portions will be described in detail.

Figure 5:
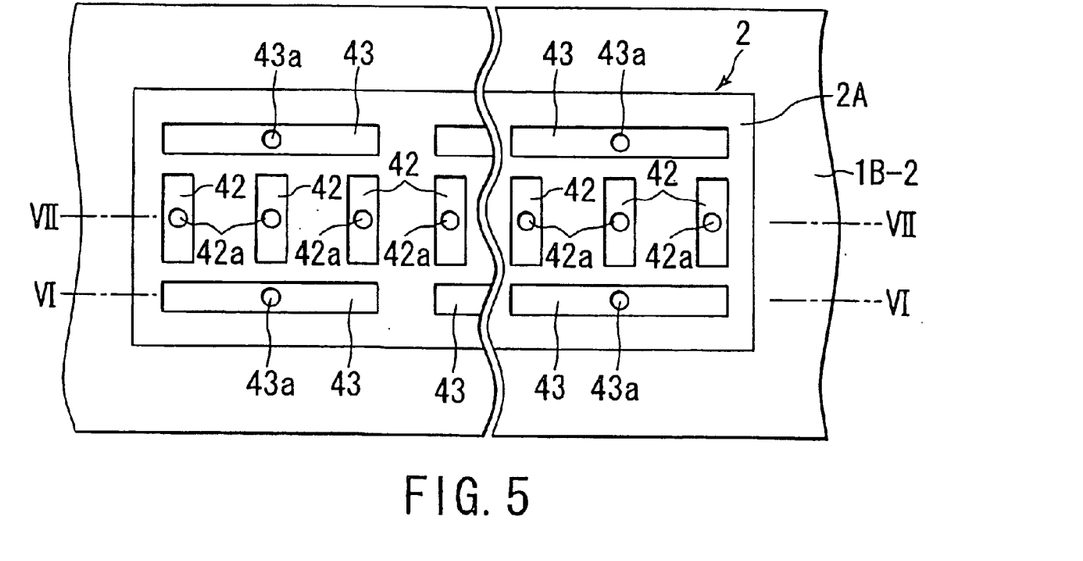
FIG. 5 is a plan view showing the attachment area of the resin tape substrate in the lower mold member of the semiconductor resin mold according to a second embodiment of the present invention.

In the first embodiment, the openings of a plurality of suction holes 3 are formed in the attachment area surface of the bottom surface 2A of the cavity 2 of the mold 1, and the suction holes 3 are connected to the same suction pump S. On the other hand, in the second embodiment, as shown in FIG. 5, a plurality of first slits 42 are formed in a middle portion of the attachment area surface of a lower mold member 1B–2 constituting the bottom surface 2A of the cavity 2 formed in the mold, and a plurality of second slits 43 are formed in a periphery of the attachment area surface. Since the upper mold member is formed similarly as FIG. 1A, the member is not shown in the second embodiment.

A first suction hole 42a is formed in each first slit 42, and a second suction hole 43a is formed in each second slit 43. Moreover, a plurality of first suction holes 42a are connected to one another via one or more connection path 42b, and subsequently connected to a first suction pump 51 shown in FIG. 8. On the other hand, a plurality of second suction holes 43a are connected to one another via one or more connection path 43b, and subsequently connected to a suction pump 52 disposed in a second suction system different from that of the first suction pump 51.

Figure 7:
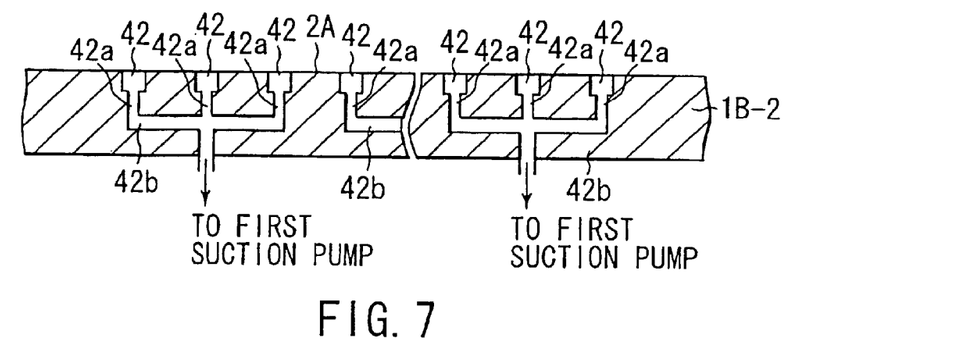
FIG. 7 is a sectional view taken along a line VII—VII of the lower mold member of the semiconductor resin mold shown in FIG. 5.

That is, as shown in FIG. 5, in the attachment area surface of the bottom surface 2A of the cavity 2, the plurality of first slits 42 elongated in a direction perpendicular to the longitudinal direction of the lower mold member 1B–2 are arranged in parallel with one another at constant intervals in the middle portion of the lower mold member 1B–2. The first suction hole 43a is formed in the bottom surface of the middle portion of each of the plurality of first slits 42. Moreover, as shown in FIG. 7, the first suction holes 42a are connected to one another via one or more connection paths 42b, and connected to the same suction pump 51 of the first suction system.

Here, the first suction holes 42a are divided into three groups positioned in the middle portion and on left and right sides, respectively. The holes of each group are connected to one another via the communication path 42b, and connected to the same first suction pump 51.

Moreover, as shown in FIG. 5, the plurality of second slits 43 elongated in the direction along the longitudinal direction of the lower mold member 1B–2 are linearly arranged at constant intervals above and below (as shown on a drawing sheet) the plurality of first slits 42. The second suction hole 43a is disposed in the bottom surface of the middle portion of each of the plurality of second slits 43.

Figure 6:
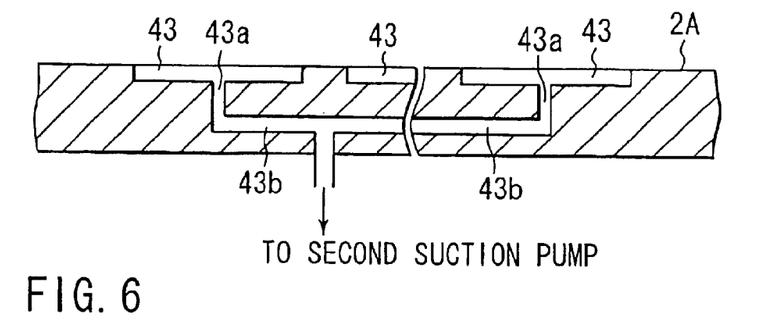
FIG. 6 is a sectional view taken along a line VI—VI of the lower mold member of the semiconductor resin mold shown in FIG. 5.

Furthermore, as shown in FIG. 6, the second suction holes 43a are connected to one another via one or more communication paths 43b, and connected to the suction pump 52 constituting the second suction system different from the first suction system.

Here, the plurality of second suction holes 43a arranged in the upper side are connected to one another via the upper communication path 43b, the plurality of second suction holes 43a arranged in the lower side are connected to one another via the lower communication path 43b, and these suction holes 43a are connected to the same second pump 53 of the second suction system.

Moreover, the carrier 40 is disposed between the upper mold member 1A and the lower mold member 1B of the mold 1, the resin tape substrate 31 having the semiconductor chips 34 is disposed in the cavity 2, and the back surface of the resin tape substrate 31 is closely attached to the attachment area surface of the bottom surface 2A of the cavity 2.

A molding method using the mold of the second embodiment will next be described.

Figure 8:
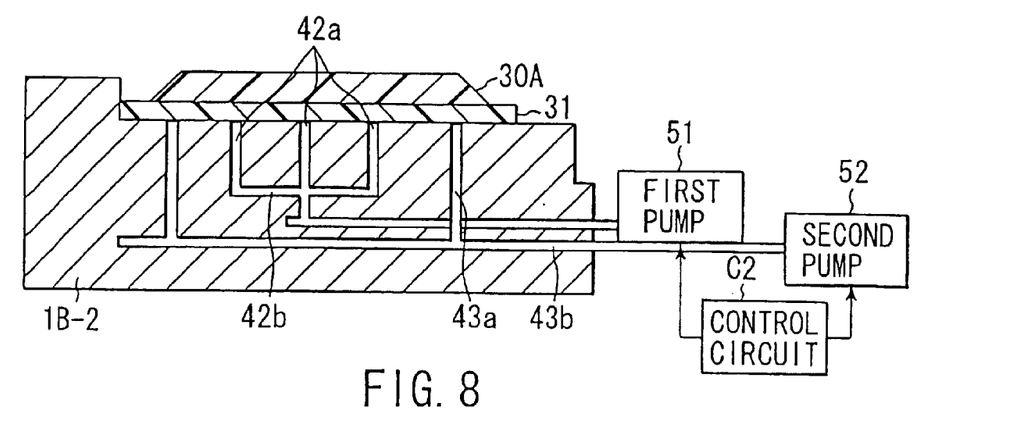
FIG. 8 is a sectional view of the lower mold member for the semiconductor resin mold of FIG. 5 connected to two suction systems.

The first suction pump 51 is first operated by an output of a control circuit C2 of FIG. 8, the air in the cavity including the space area in the first slit 42b is sucked via the first suction hole 42a to reduce the pressure in the cavity in the mold, and the middle portion of the resin tape substrate 31 excluding the upper and lower portions thereof (as shown on the drawing sheet) is sucked/fixed to the middle portion of the attachment area surface. Thereby, air present between the middle portion of the resin tape substrate 31 and the attachment area surface is pushed out to the peripheral portion of the resin tape substrate 31. As shown by a graph K1 of FIG. 10, a suction state reaches a final suction force of 130 (Pa) in about one second, and subsequently this pressure is kept.

Subsequently, after the middle portion of the resin tape substrate 31 is sucked/fixed, the second suction pump 52 is started by the output of the control circuit C2. The air of the space area in the second slit 43a is sucked by the second suction hole 43b to reduce the pressure in the cavity, and the upper and lower peripheral portions of the resin tape substrate 31 are sucked/fixed to the peripheral portion of the attachment area surface.

A change of the suction force is controlled by the control circuit C2 in the following manner. As shown by a graph K2 of FIG. 10, the pump 52 is driven one second after the pump 51 is driven. When the pressure in the first suction system reaches at a constant value as indicated by the graph K1, the suction force of the pump 52 rises. Then, the suction force of the pump 52 is stabilized at the same pressure as that of K1 about two seconds after the suction force, so that an inclination of the graph K2 is slightly less than that of the graph K1. That is, the total suction force is stabilized by three seconds after the suction force of graph K1 starts to rise.

Moreover, similarly as the first embodiment, the molten resin 30A is supplied into the cavity 2, the upper surface of the resin tape substrate 31 including the mount portion of the semiconductor chip 34 is molded, and the resin molded body 30 with the back surface of the resin tape substrate 31 exposed therefrom is formed.

Additionally, in the pressure control graph of FIG. 8, the rising inclinations shown by graphs K1 and K2 can be set to substantially the same value.

According to the second embodiment, in addition to the action/effect similar to that of the first embodiment, the following action/effect is obtained.

That is, the plurality of first slits 42 and second slits 43 connected to the suction systems 51, 52, respectively, via the first and second suction holes 42a and 43a are formed in the attachment area surface of the bottom surface 2A of the cavity 2 in the lower mold member 1B–2. In other words, the openings of the slits 42 and 43 are considered as the enlarged openings of the suction holes 42a and 43a, thereby enlarging the sucking area per one suction hole. Therefore, as compared with the suction holes 3 of the first embodiment, the whole resin tape substrate 31 can more firmly be sucked/fixed onto the attachment area surface of the bottom surface 2A of the cavity 2. Therefore, the resin tape substrate 31 can substantially completely be prevented from warping by heating during resin molding, and the molten resin 30A supplied into the cavity 2 can substantially completely be prevented from disadvantageously entering to the back surface of the resin tape substrate 31.

Moreover, in the resin molding method, the back surface of the resin tape substrate 31 can be closely attached to the attachment area surface of the bottom surface 2A of the cavity 2. The first suction system 51 is operated, and the air present between the middle portion of the resin tape substrate 31 and the attachment area surface is first discharged to the peripheral portion of the resin tape substrate 31 by the first slit 42. Then, the middle portion of the resin tape substrate 31 excluding the upper and lower portions is sucked/fixed to the middle portion of the attachment area surface.

Thereafter, the second suction system 52 is operated, and the upper and lower peripheral portions of the resin tape substrate 31 are sucked/fixed to the peripheral portion of the attachment area surface by the second slit 43.

Thereby, the attachment area surface of the bottom surface 2A of the cavity 2 and the back surface of the resin tape substrate 31 can adhere to each other while no air remains therebetween. As a result, the molten resin 30A supplied into the cavity 2 is prevented from flowing to the back surface of the resin tape substrate 31. Therefore, the molding defect of the resin molded body with the back surface of the resin tape substrate 31 exposed therefrom, and the molding defect of the resin molded body by the resin uncharged portion in the semiconductor chip on the upper surface of the resin tape substrate can be prevented. Additionally, the productivity of the resin molded semiconductor device can remarkably be enhanced.

The present invention is not limited to the aforementioned embodiments, and can variously be modified within the scope of the appended claims.

For example, in the second embodiment, the second slit 43 is disposed crossing at right angles to the first slit 42. However, all the slits may be disposed in the vertical direction similarly as the first slit, and the length of the slit may substantially be the same in size as the width of the attachment area surface (the width of the vertical direction of the drawing sheet). In this case, the plurality of slits disposed in left and right outer portions may serve as the second slits, and the plurality of slits in the middle portion held between the second slits may serve as the first slits.

Moreover, in the second embodiment, the first slit 42 is disposed in the direction crossing at right angles to the second slit 43, but the first slit 42 may be disposed in parallel with the second slit 43.

According to the aspect of the semiconductor resin mold of the present invention, the molten resin supplied in the cavity can be prevented from disadvantageously flowing to the back surface of the resin tape substrate.

Furthermore, according to the aspect of the semiconductor resin molding method of the present invention, the molding defect of the resin molded body with the back surface of the resin tape substrate exposed therefrom, and the molding defect of the resin molded body by the resin uncharged portion in the semiconductor chip on the upper surface of the resin tape substrate can be prevented. Additionally, the productivity of the resin molded semiconductor device can remarkably be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor resin molding method of sealing a mount portion of a semiconductor chip on a resin tape substrate with a resin molded body excluding a back surface of the resin tape substrate, said method comprising:

preparing a mold comprising a cavity having a plurality of suction holes connectable to a suction system in an attachment surface to which said resin tape substrate is attached, the plurality of suction holes being grouped into a first group of suction holes and a second group of suction holes;

attaching said resin tape substrate to the attachment surface of the cavity of said mold;

sucking/fixing said resin tape substrate to the attachment surface of said cavity after attaching said resin tape substrate to the attachment surface by first sucking the resin tape substrate through the first group of suction holes and then sucking the resin tape substrate through the second group of suction holes after a lapse of a predetermined time interval; and supplying a resin into the cavity of said mold after the step of sucking/fixing said resin tape substrate onto the attachment surface.

2. The semiconductor resin molding method according to claim 1, wherein the first group of said plurality of suction holes are disposed in a middle portion of said attachment surface and the second group being in a periphery of the middle portion.

3. The semiconductor resin molding method according to claim 1, wherein said suction holes are disposed in a plurality of slits formed in said attachment surface.

4. The semiconductor resin molding method according to claim 1, wherein said suction holes have openings disposed in a plurality of slits formed in said attachment surface.

5. The semiconductor resin molding method according to claim 2, wherein said first group of suction holes in the middle portion of said attachment surface and said second group of suction holes in a periphery of the middle portion are connectable to different suction systems.

6. The semiconductor resin molding method according to claim 4, wherein said suction holes in the middle portion of said attachment surface and said suction holes in a periphery of the middle portion are connectable to different suction systems.

7. The semiconductor resin molding method according to claim 5, wherein said step of sucking/fixing said resin tape substrate attached to the attachment surface of said cavity comprises:

sucking/fixing the middle portion of said resin tape substrate by said first group of suction holes in the middle portion of said attachment surface; and subsequently sucking/fixing said resin tape substrate by said second group of suction holes in the periphery of the middle portion of said attachment area surface.

8. The semiconductor resin molding method according to claim 5, wherein said different suction systems are driven at a predetermined time interval.

9. The semiconductor resin molding method according to claim 6, wherein said different suction systems are driven at a predetermined time interval.

* * * * *

UNITED STATES PATENT AND TRADEMARK OFFICE
CERTIFICATE OF CORRECTION

PATENT NO. : 6,787,093 B2
DATED : September 7, 2004
INVENTOR(S) : Kiritani

It is certified that error appears in the above-identified patent and that said Letters Patent is hereby corrected as shown below:

Column 10,
Line 32, change "claim 1," to -- claim 2, --.

Signed and Sealed this

Fourth Day of January, 2005

JON W. DUDAS
*Director of the United States Patent and Trademark Office*